United States Patent [19]
Verhaeghe et al.

[11] Patent Number: 5,999,461
[45] Date of Patent: Dec. 7, 1999

[54] LOW VOLTAGE BOOTSTRAPPING CIRCUIT

[75] Inventors: Donald J. Verhaeghe; Dennis R. Wilson, both of Colorado Springs, Colo.

[73] Assignee: Ramtron International Corporation, Colorado Springs, Colo.

[21] Appl. No.: 08/663,032

[22] Filed: Jun. 7, 1996

[51] Int. Cl.⁶ ................................................. G11C 7/00
[52] U.S. Cl. ........................ 365/189.11; 365/189.09; 365/230.06
[58] Field of Search ................. 365/189.11, 189.09, 365/230.06, 149

[56] References Cited

U.S. PATENT DOCUMENTS

| | | | |
|---|---|---|---|
| 4,291,393 | 9/1981 | Wilson | 365/203 |
| 4,397,003 | 8/1983 | Wilson et al. | 365/205 |
| 5,128,563 | 7/1992 | Hush et al. | 307/482 |
| 5,329,186 | 7/1994 | Hush et al. | 307/482 |
| 5,349,247 | 9/1994 | Hush et al. | 307/451 |
| 5,400,291 | 3/1995 | Naritake et al. | 365/189.01 |
| 5,563,842 | 10/1996 | Challa | 365/230.06 |
| 5,818,760 | 10/1998 | Baldi et al. | 365/185.23 |

*Primary Examiner*—Vu A. Le
*Attorney, Agent, or Firm*—Peter J. Meza

[57] ABSTRACT

A bootstrap circuit suitable for use in driving the word line of a FRAM® memory circuit is energized by a VDD power supply voltage. The bootstrap circuit includes a first N-channel MOS transistor wherein the source/drain forms the input of the circuit. A second N-channel MOS transistor is included wherein one of the source/drains receives a clock signal, and the other source/drain forms the output, which drives the word line. The gate of the second transistor is coupled to the other source/drain of the first transistor. The bootstrap circuit includes further circuitry for generating a voltage greater tan the VDD power supply voltage that is coupled to the gate of the first transistor. A capacitor or capacitor-connected transistor is coupled between the input and the gate of the first transistor, and a third transistor has one source/drain coupled to the gate of the first transistor, and the other source/drain receives a control signal, and the gate is coupled to the VDD power supply. The bootstrap circuit is operational even for VDD power supply voltages less than or equal to 3.3 volts.

22 Claims, 9 Drawing Sheets

LOW VOLTAGE BOOTSTRAPPING CIRCUIT

BACKGROUND OF THE INVENTION

This invention relates generally to integrated circuit memories, and, more particularly, to a bootstrapped word line decoder circuit for providing voltages at or above a full VDD potential to a word line load.

This application is related to a copending application assigned to the assignee of the present application entitled "Bootstrapping Circuit Utilizing a Ferroelectric Capacitor", Ser. No. 08/620,799, filed on Mar. 28, 1996, which is hereby incorporated by reference.

There are many bootstrapping circuits in existence, which are generally known to include capacitive coupling for the purpose of increasing the voltage on a gate of an NMOS transistor so that one source/drain node of the NMOS transistor can deliver the full voltage on the other source/drain node, usually a VDD power supply voltage. Some prior art bootstrapping circuits rely on a large chargestorage element to supply the necessary charge during the bootstrapping operation. These circuits therefore do not lend themselves to being used in "pitched" circuitry, which is necessary for a compact layout configuration. Another problem in prior art bootstrapping circuits is that they become inoperable under low power supply voltage conditions, i.e. power supply voltages less than or equal to 3.3 volts. This is especially true for situations wherein the threshold voltage, $V_{TH}$, of the MOS transistors used becomes equal to 50% of the operating power supply voltage VDD.

Turning now to FIG. 1, a portion of a typical memory architecture 10 is shown. Memory architecture 10 includes an address buffer 16 for receiving a control signal designated CNTRL SIG on line 12 and an external address bus designated EXT ADD on bus 14. Address buffer 16 generates internal address signals designated INT ADD on bus 18, which is received by an address decoder 20. Address decoder 20 generates decoded word line address signals designated AI, AJ, and AK, on lines 22, 24, and 26, respectively. The decoded word line address signals are received by multiple word line decoders, one for every row of memory cells in memory array 44. Four representative word line decoders 28, 30, 32, and 34 are shown in FIG. 1, designated WL DECODER 1, WL DECODER 2, WL DECODER N-1, and WL DECODER N, respectively. The outputs of the word line decoders are designated WL1, WL2, WLN-1, and WLN on word lines 36, 38, 40, and 42, respectively. Word lines 36–42 are coupled to a memory array 44. The rows and columns of memory cells in memory array 44 are not shown. Two control signals designated CTL and WLCLK are generated by a control and timing logic block 46. The CTL signal is a control signal on line 50, and the WLCLK signal is a clock signal on line 52.

Turning now to FIG. 2, the schematic diagram for a typical prior art word line decoder 28 is shown. Word line decoder 28 is suitable for in-pitch layout, but has low voltage performance problems as is further described below. Address signals AI, AJ, and AK are received at nodes 22, 24, and 26 by a three-input NAND gate 60. The output of NAND gate 60 is coupled to one input of a two-input NOR gate 62. The other input of NOR gate 62 receives the CTL control signal at node 50. The output of NOR gate 62 is coupled to a source/drain (current node) of transistor 66 through line 64. The signal on line 64 is designated WLEN. The gate (control node) of transistor 66 is coupled to the VDD power supply voltage. The other source/drain of transistor 66 is coupled to the gate of transistor 70 through line 68. The signal on line 68 is designated WL'. One source/drain of transistor 70 receives the WLCLK signal at node 52 and the other source/drain of transistor 70 is the output of word line decoder 28 coupled to a word line at node 36.

In operation, a word line is selected when all three address signals are high. Some time after the word line is selected the CTL signal is activated, which isolates transistor 66. Some time after the CTL signal is activated, the WLCLK signal is activated, which bootstraps the WL' voltage to a voltage greater than the VDD power supply voltage, assuring that the full pulsed value of the WLCLK signal (the VDD power supply voltage, typically five volts) appears at the output on node 36.

While the prior art word line decoder described above will provide the full VDD power supply voltage to the selected word line when a five volt power supply is used, performance becomes compromised when the power supply voltage is dropped to 3.3 volts or less. At these low voltages, which can actually be specified to as low as about 2.5 volts, the body-affected threshold voltage, $V_{TH}$, of the transistors used in the design can become a significant portion of the available voltage. When $V_{TH}$ is about 50% of VDD, word line decoder 28 becomes inoperable. Since the gate of transistor 66 is coupled to VDD, the voltage WL' on line 68 will be VDD—$V_{TH}$, which is approximately equal to $V_{TH}$ under low voltage conditions. Since the output at node 36 is also required to be driven above ground (preferably to VDD volts), there is no voltage to turn on transistor 70 and word line decoder 28 becomes inoperable.

What is desired, therefore, is a word line decoder that maintains the useful qualities of the prior art word line decoder circuit described above, such as all N-channel transistors in the main signal path, and an in-pitch layout configuration, but that is able to operate at very low VDD voltage conditions less than or equal to 3.3 volts.

SUMMARY OF THE INVENTION

It is, therefore, a principal object of the present invention to enable a bootstrap circuit to remain operational in situations where the body-affected threshold voltage of the devices is 50% of the operating voltage.

It is a further object of the present invention to enable a bootstrap circuit to remain operational in low VDD power supply voltage conditions.

It is an advantage of the invention that the bootstrap circuit requires no large capacitive element and thus can be used with "in-pitch" layouts required for memory circuits.

It is another advantage of the invention that only N-channel transistors are used in the main signal path.

It is a feature of the invention that it is particularly well suited for use in ferroelectric random-access memory (FRAM®) circuits.

According to the present invention, a bootstrap circuit suitable for use in driving the word line of a FRAM® memory circuit is energized by a VDD power supply voltage. The bootstrap circuit includes a first N-channel MOS transistor wherein the source/drain forms the input of the circuit. A second N-channel MOS transistor is included wherein one of the source/drains receives a clock signal, and the other source/drain forms the output, which drives the word line. The gate of the second transistor is coupled to the other source/drain of the first transistor. The bootstrap circuit of the present invention includes further circuitry for generating a voltage greater than the VDD power supply voltage that is coupled to the gate of the first transistor. A capacitor or capacitor-connected transistor is coupled between the input and the gate of the first transistor, and a third transistor has one source/drain coupled to the gate of the first transistor, and the other source/drain receives a control signal, and the gate is coupled to the VDD power supply.

In operation, the output voltage is bootstrapped in two stages to deliver the full VDD voltage on the output node. The bootstrap circuit is operational at even low VDD power supply voltages because the gate of the first transistor is bootstrapped to a voltage above VDD, thus allowing the second transistor sufficient turn-on voltage to be effective in the second stage of bootstrapping.

When placed in a word line decoder circuit, an input section is added, which includes multiple address inputs for receiving decoded word line addresses and an output coupled to the input of the bootstrap circuit. The input section of the word line decoder further includes a precharge input for receiving a precharge signal and, in one embodiment, a control input for receiving a second control signal.

In a first embodiment, the input section includes an input logic gate having multiple inputs for receiving the decoded word line addresses and the precharge signal, and a NOR gate having a first input coupled to the output of the logic gate, a second input for receiving the second control signal, and an output coupled to the input of the bootstrap circuit. A fourth P-channel MOS transistor is coupled between the VDD power supply voltage and the output of the multiple input logic gate, and the gate is coupled to the input of the bootstrap circuit. A fifth N-channel transistor is used to clamp the output of non-selected word lines and is coupled between the output of the bootstrap circuit and ground, and the gate is coupled to the output of the input logic gate.

In a second embodiment, the input section includes an input logic gate having multiple inputs for receiving the decoded word line addresses and the precharge signal, and an inverter having an input coupled to the output of the multiple input logic gate, and an output coupled to the input of the bootstrap circuit. A fourth P-channel MOS transistor is coupled between the VDD power supply voltage and the output of the multiple input logic gate, and the gate is coupled to the input of the bootstrap circuit. A fifth N-channel transistor is used to clamp the output of non-selected word lines and is coupled between the output of the bootstrap circuit and ground, and the gate is coupled to the output of the input logic gate.

The foregoing and other objects, features and advantages of the invention will become more readily apparent from the following detailed description of a preferred embodiment of the invention which proceeds with reference to the accompanying drawings.

Figure 3:
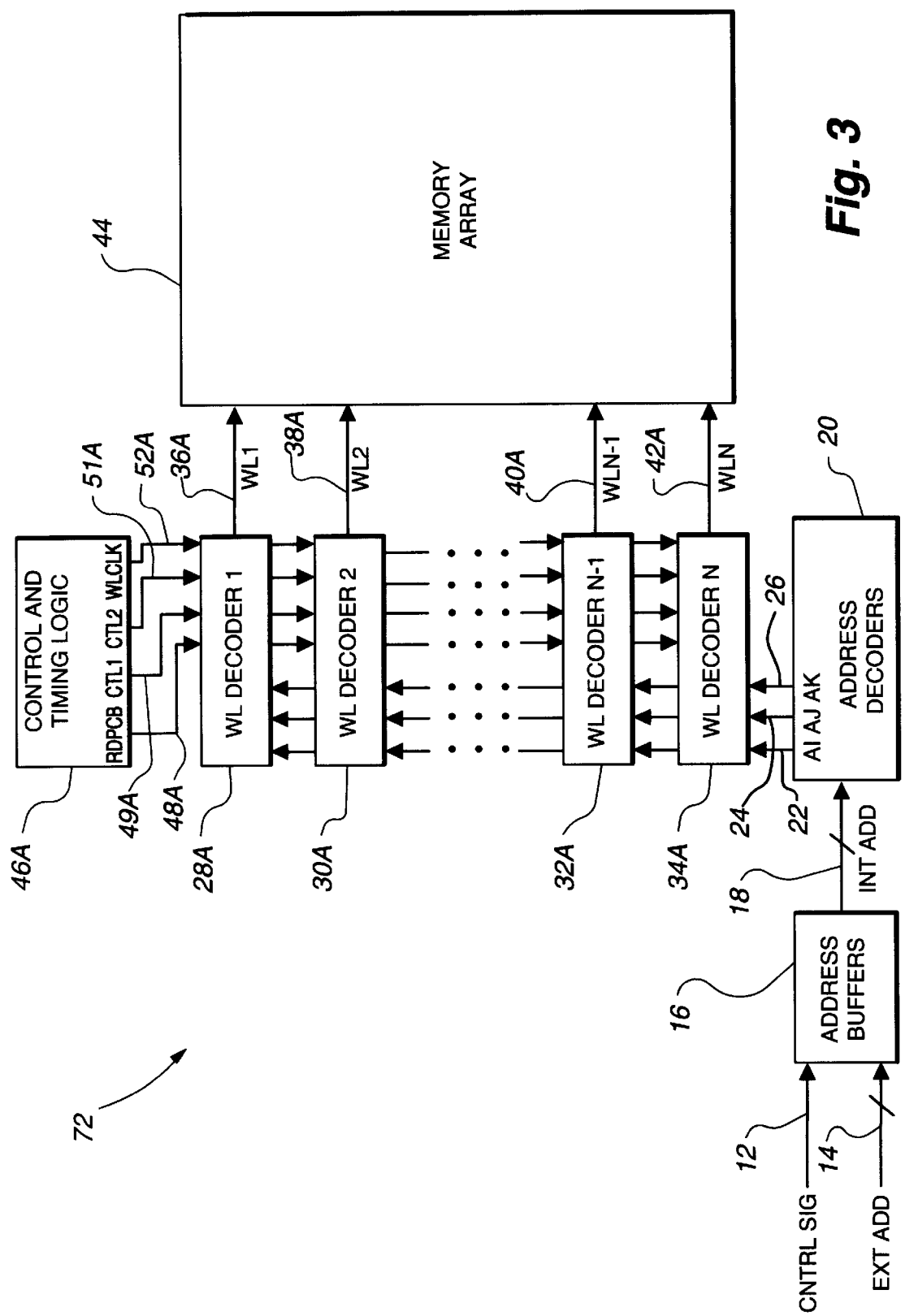
Figure 4:
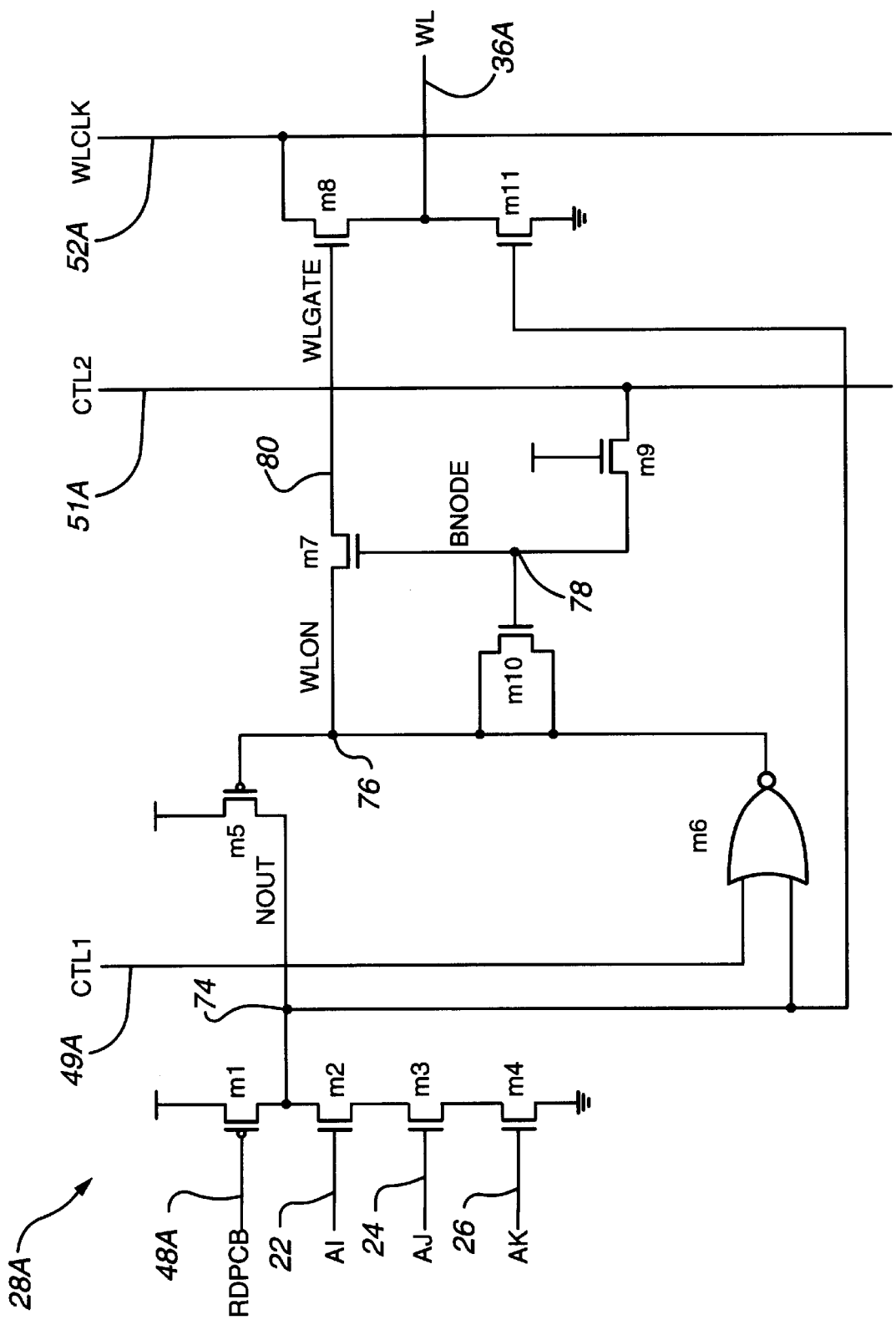
Figure 5:
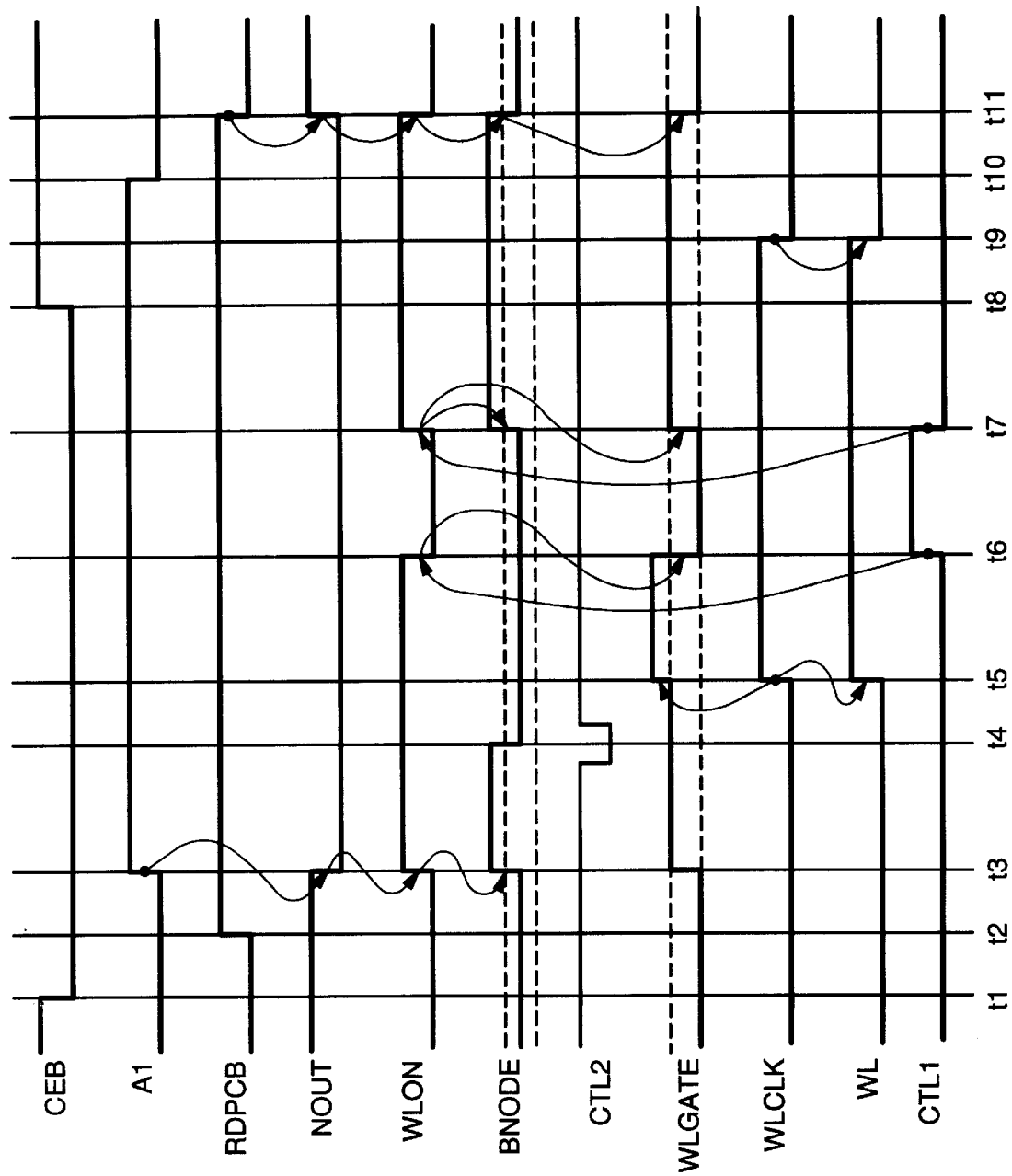
Figure 6:
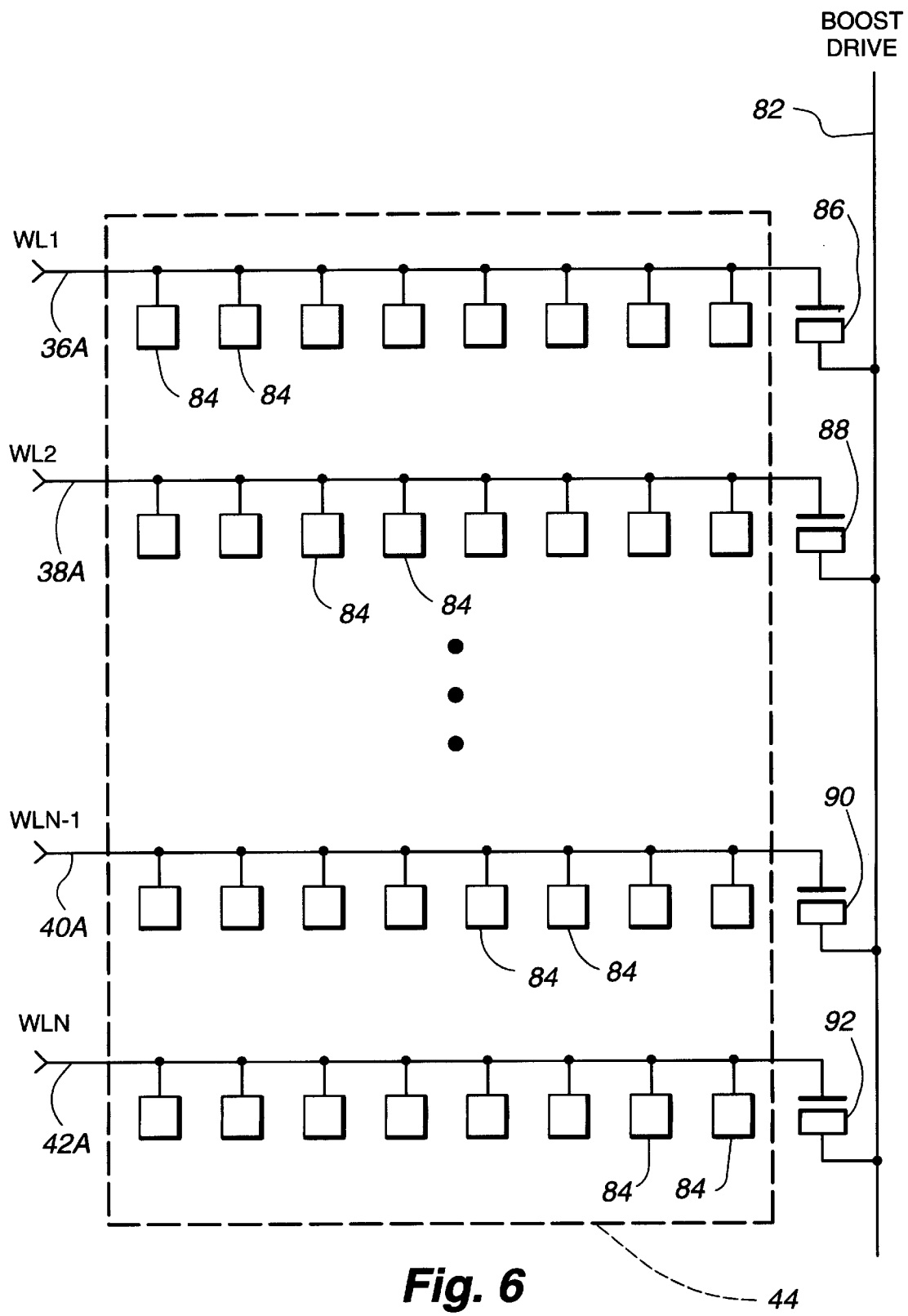
Figure 7:
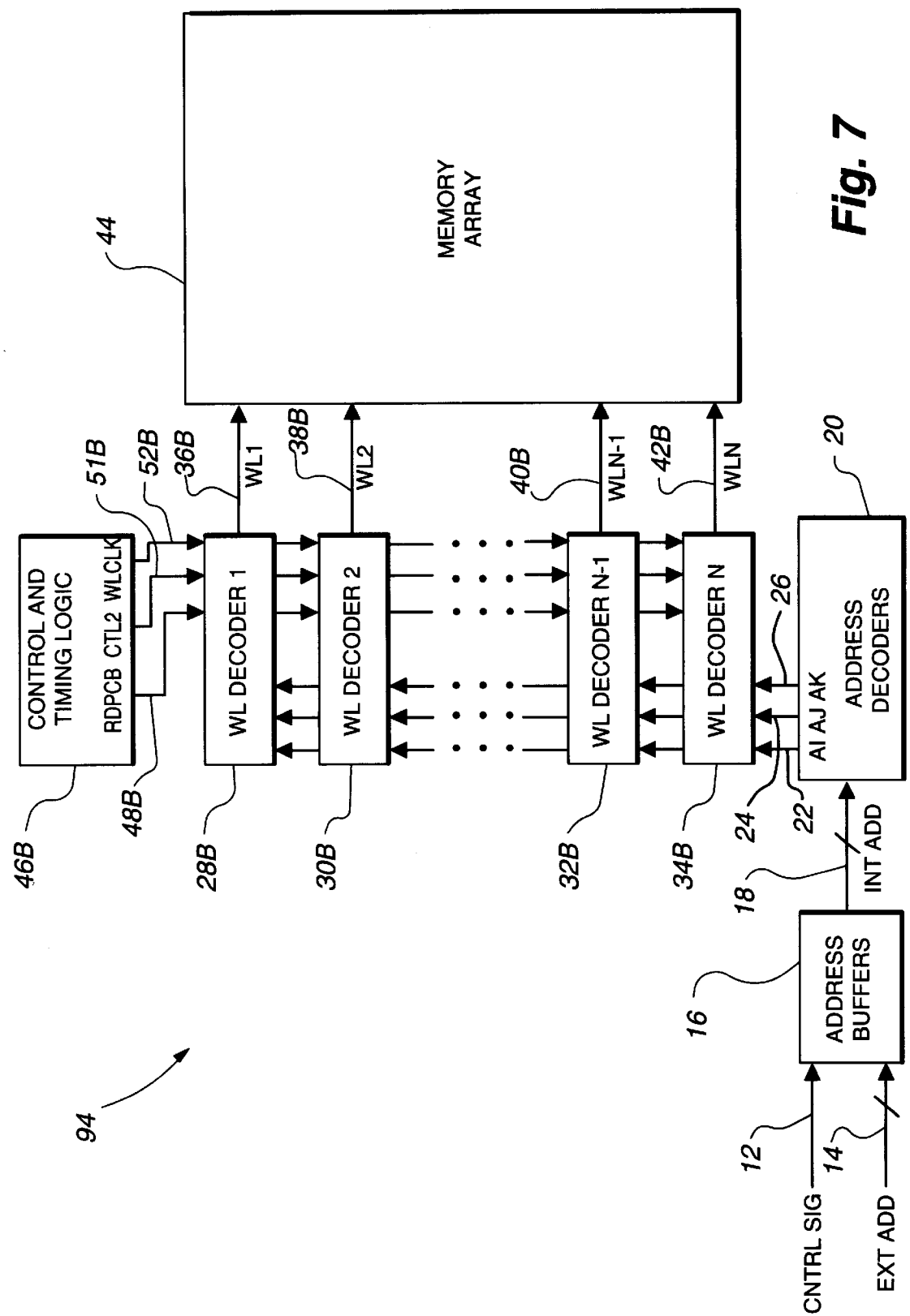
Figure 8:
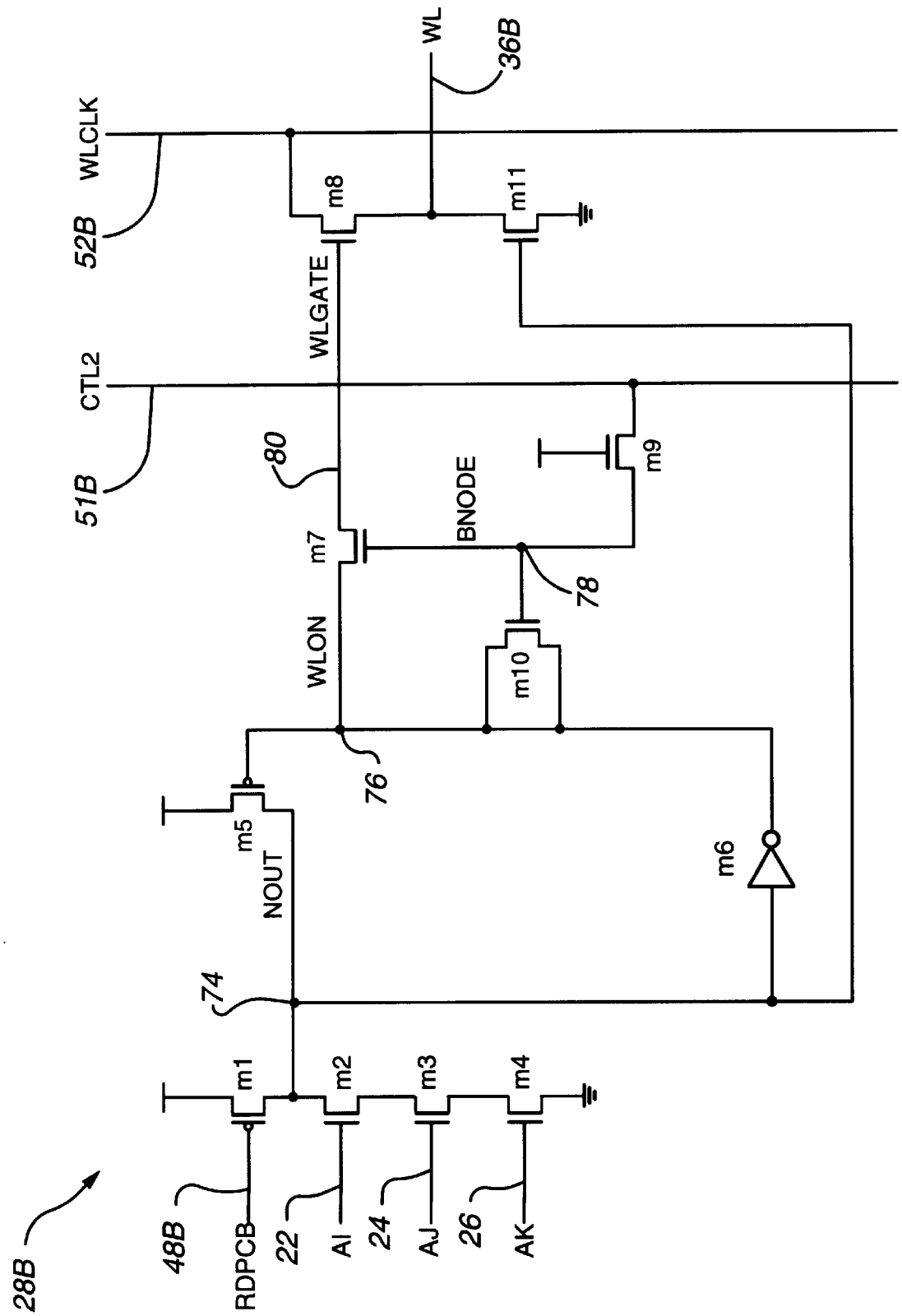
Figure 9:
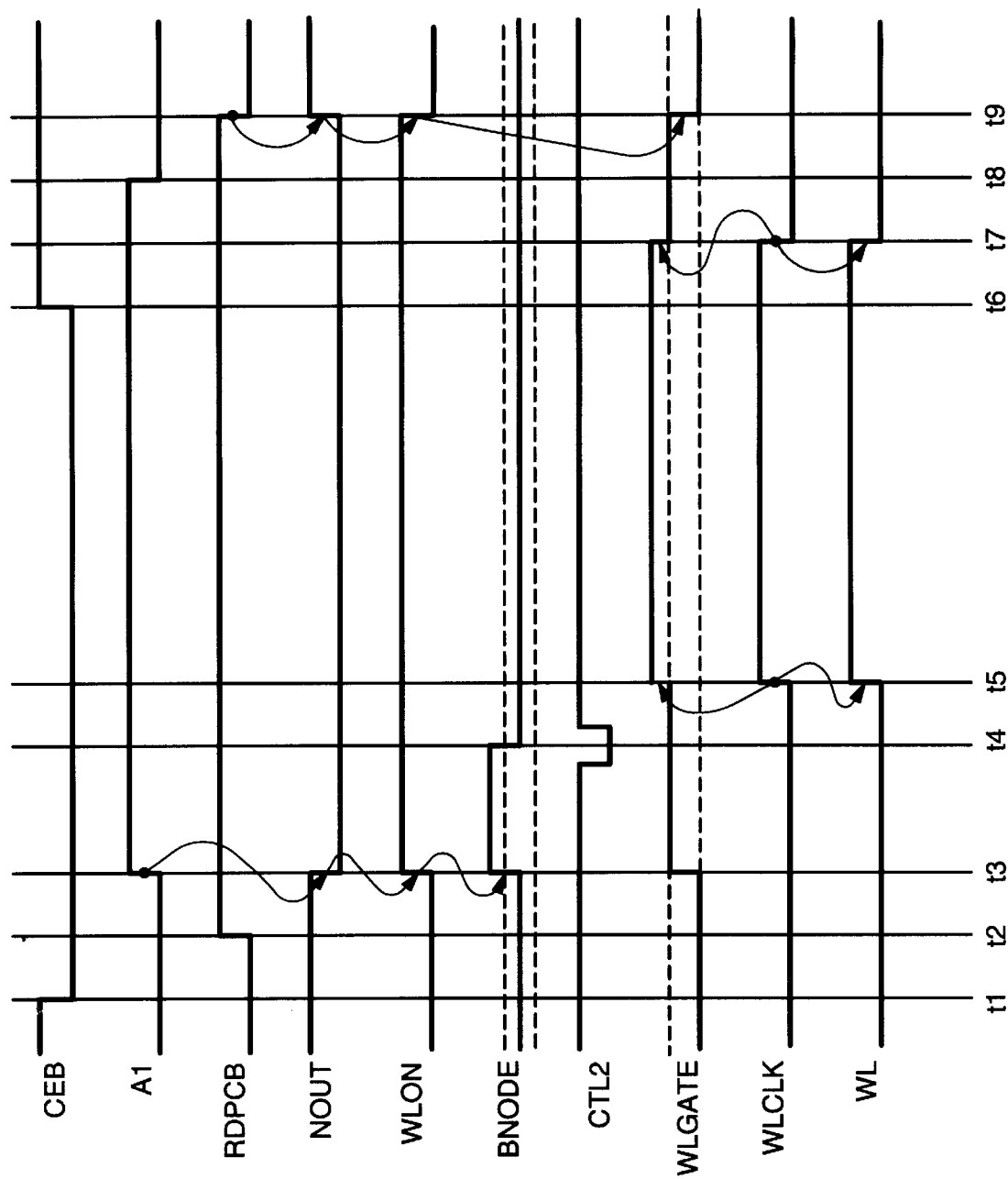

FIG; 2 is a schematic diagram of a prior art word line decoder circuit;

FIG. 3 is a block diagram of a portion of a memory architecture showing word line decoders, a memory array, and supporting circuit blocks according to the present invention;

FIG. 4 is a schematic diagram of the word line decoder shown in block form in FIG. 3 including a bootstrap circuit according to one embodiment of the present invention;

FIG. 5 is a timing diagram associated with the word line decoder circuit shown in FIG. 4;

FIG. 6 is a schematic diagram of an optional, additional word line boosting circuit suitable for use with the word line decoder of FIG. 4;

FIG. 7 is a block diagram of a portion of a memory architecture showing word line decoders, a memory array, and supporting circuit blocks according of the present invention;

FIG. 8 is a schematic diagram of the word line decoder shown in block form in FIG. 7 including a bootstrap circuit according to another embodiment of the present invention; and FIG. 9 is a timing diagram associated with the word line decoder circuit shown in FIG. 8.

DETAILED DESCRIPTION

Turning now to FIG. 3, a portion of a typical memory architecture 72 according to the present invention is shown. Memory architecture 72 also includes an address buffer 16 for receiving the CNTRL SIG control signal on line 12 and the EXT ADD external address signals on bus 14. Address buffer 16 generates the INT ADD internal address signals on bus 18, which is received by an address decoder 20. Address decoder 20 generates decoded word line address signals designated AI, AJ, and AK, on lines 22, 24, and 26, respectively. The decoded word line address signals are received by multiple word line decoders, one for every row of memory cells in memory array 44. Four representative word line decoders 28A, 30A, 32A, and 34A according to a first embodiment of the present invention are shown in FIG. 3, and are designated WL DECODER 1, WL DECODER 2, WL DECODER N–1, and WL DECODER N, respectively. The outputs of the word line decoders are designated WL1, WL2, WLN–1, and WLN on word lines 36A, 38A, 40A, and 42A, respectively. Word lines 36A–42A are coupled to a memory array 44. The rows and columns of memory cells in memory array 44 are not shown, but can be either DRAM or FRAM® memory cells. Four control signals designated RDPCB, CTL1, CTL2, and WLCLK are generated by a control and timing logic block 46A. The RDPCB signal is a precharge signal on line 48A, the CTL1 and CTL2 signals are control signals on lines 49A and 51A, and the WLCLK signal is a clock signal on line 52.

Turning now to FIG. 4, the schematic diagram for a first embodiment of a word line decoder 28A according to the present invention is shown. Word line decoder 28A is suitable for in-pitch layout, and remains operational under low voltage VDD conditions. The core of word line decoder 28A is a bootstrap circuit including transistors M7 and M8, as well as circuitry coupled to the gate of transistor M7 for generating a voltage in excess of the VDD power supply voltage. The operation and precise timing of the bootstrap circuit and the entire word line decoder is explained in further detail below, particularly with respect to the timing diagram of FIG. 5. One source/drain of transistor M7 forms the input to the basic bootstrap circuit at node 76. The voltage at node 76 is designated WLON. The other source/drain of transistor M7 is coupled to node 80, the voltage at that node being designated WLGATE. The gate of transistor M7 is coupled to node 78, which receives the BNODE voltage, which can be temporarily in excess of the VDD power supply voltage. One source/drain of transistor M8 is coupled to node 52A for receiving the WLCLK clock signal. The other source/drain of transistor M8 forms the output of both the basic bootstrap circuit, as well as the entire word line decoder 28A at node 36A, designated WL (for word line). The gate of transistor M8 is coupled to the source/drain of transistor M7 at node 80.

Circuitry, including transistor M9, capacitor-connected transistor M10, and control signal CTL2, for generating a voltage greater than the VDD power supply voltage is coupled to the gate of transistor M7. A capacitor, such as capacitor-connected transistor M10, is coupled between node 76 (source/drain of transistor M7) and node 78 (gate of transistor M7). In FIG. 4, both source/drains of transistor M10 are coupled together to form one plate of the capacitor, and the gate of transistor M10 forms the other plate of the capacitor. Other capacitor-connected transistor configurations can be used, or any oxide capacitor can be used. Ideally, capacitor-connected transistor M10 is a capacitor-connected MOS depletion-mode transistor having a low threshold voltage, wherein the channel of the transistor remains intact regardless of the voltage level at node 76. In other words, the capacitance should remain relatively constant when, node 76 rises to VDD volts. The size of transistor M10 is determined by the total capacitance of node 78. Ideally, the ratio of the capacitance of transistor M10 to the total capacitance of node 78 (including the capacitance of transistor M10) should be greater or equal to 0.8. A source/drain of transistor M9 is coupled to node 78, and the other source/drain of transistor M9 receives the CTL2 control signal at node 51A. The gate of transistor M9 is coupled to the VDD power supply.

The basic bootstrap circuit described above further includes an input section including multiple address inputs for receiving decoded word line addresses AI, AJ, and AK, as well as inputs for receiving the RDPCB precharge signal, and the CTL1 control signal. The output of the input section is coupled to the input of the bootstrap circuit at node 76. The input section and the bootstrap circuit together form the complete circuit of word line decoder 28A shown in FIG. 4.

The input section for word line decoder 28A includes a multiple input logic gate including transistors M1, M2, M3, and M4. Transistor M1 is a P-channel MOS transistor, and transistors M2–M4 are N-channel MOS transistors. Transistors M1–M4 are coupled in a cascode manner to form a modified three-input NAND gate. The gates of transistors M1–M4 form the inputs of the modified NAND gate, the gate of transistor M1 receiving the RDPCB signal, and the gates of transistors M2–M4 receiving the AI, AJ, and AK signals. A NOR gate M6 has a first input coupled to the output of the multiple input logic gate at node 74, a second input for receiving the CTL1 control signal, and an output coupled to node 76. Transistor M5, which is a P-channel MOS transistor, has one source/drain coupled to the VDD power supply and the other source/drain coupled to node 74. The gate of transistor M5 is coupled to node 76, which is the output of the input section of word line decoder 28A Finally, an additional clamping transistor M11 is used to clamp the output node 36A to ground for non-selected word lines. Transistor M11 has one source/drain coupled to the output of the bootstrap circuit/word line decoder 28A at node 36A, the other source/drain coupled to ground, and the gate coupled to node 74.

The word line decoder circuit 28A shown in FIG. 4 is used to drive a signal (WL drives word line 36A in this case) to VDD without the use of any P-channel devices in the main signal path. The ability to drive the load to the full VDD power supply voltage remains even though low power supply conditions on the circuit are such that the body-effected $V_{TH}$ of the N-channel devices are roughly 50% of VDD. To produce a signal that would be at VDD under these conditions, two stages of bootstrapping were employed. The timing for achieving these two stages of bootstrapping is described below with reference to the timing diagram of FIG. 5.

Referring to FIG. 5, at an initial time before t1, the following signals are low: A1 (the logical AND of AI, AJ, and AK); RDPCB; WLON; WLGATE, WLCLK, WL, and CTL1. Before time t1 the following signals are high: CEB ("chip enable bar", which is part of the CNTRL SIG shown at line 12 in FIG. 3); NOUT; and CTL2. The BNODE signal is at a voltage between the one and zero logic levels, typically VDD and ground. The nominal voltage for the BNODE signal is equal to $VDD-V_{TH}$. At time t1 the cycle of driving the word line to the full VDD voltage begins by driving CEB low. At time t2, the RDPCB signal is driven high, which allows NOUT to respond to A1. At time t3, all of the decoded addresses AI, AJ, and AK are high (A1 is therefore high). The NOUT signal is driven low, driving WLON to VDD. Since transistor M9 is off, BNODE now couples up to a voltage higher than the VDD power supply voltage due to the source/drain-to-gate coupling of capacitor-connected device M10. Since BNODE drives the gate of transistor M7, the WLGATE signal also rises up to equal the WLON signal level (as long as BNODE is at least equal to $VDD+V_{TH}$). With WLGATE at VDD, some time before time t4, CTL2 is brought low to drain the charge off of node 78 (BNODE) in order to turn off and isolate transistor M7 so that the next stage of bootstrapping can occur. The BNODE signal can be seen to return to its previous low value (which is not ground potential) at time t4. It is important to note that CTL2 is brought low only long enough to bring BNODE back to a voltage where transistor M7 is isolated (voltages less than $VDD+V_{TH}$). Signal CTL2 can be seen to return high at some time shortly after time t4.

Once transistor M7 is isolated (WLON and WLGATE are high, and BNODE is less than $VDD+V_{TH}$), the WLCLK signal is brought high at time t5. The WLCLK signal now couples charge into node 80 (WLGATE), causing WLGATE to bootstrap above VDD. Now transistor M8 drives the WL signal to a full VDD value since WLGATE is bootstrapped to a value greater than $VDD+V_{TH}$.

In certain situations it is desirable that the word lines be further bootstrapped to a level above the VDD power supply voltage. For example, in FRAM® memories it is desirable that the word line be bootstrapped above the VDD voltage to overcome the threshold drop of the access transistor in the memory cell in order to deliver the full VDD voltage to the ferroelectric capacitor in the memory cell. If the word line is going to be further bootstrapped, another control signal CTL1 is needed. At time t6, before the additional bootstrapping is required, control signal CTL1 is driven high, which forces WLON low. Since BNODE is at $VDD-V_{TH}$, device M7 turns on and pulls the charge back off of WLGATE at node 80. This now isolates device M8 so that the word line is free to be bootstrapped above VDD. Once device M8 is sufficiently isolated, CTL1 is brought back low at time t7 so that device M5 will not fight devices M2–M4 for very long. In other words, a current path from VDD to ground is formed when WLON is low and AI, AJ, and AK are high. This current path causes excessive power dissipation and its duration should be kept to a minimum. Transistor M5 is purposely sized quite small relative to the size of transistors M2–M4 in the preferred embodiment This is done to keep the current flowing through transistors M5 and M2–M4 to a minimum, and so that the low level of the NOUT signal never approaches the $V_{TH}$ of transistor M11 during the time period between t6 and t7. Similarly, the CTL1 signal pulse is also kept to a minimum.

Once the word line has been driven to the full VDD voltage, and further bootstrapped above the VDD voltage, if desired, the initial conditions are restored in anticipation of the next cycle. At time t5, the CEB signal is restored high. At time t9, WLCLK is driven low, which also returns the word line signal WL to the low value. At time t10, the decoded word line address signals (A1) are removed. At time t11, the RDPCB signal is driven low, which causes WLON and WLGATE to return low, and NOUT to return to the initial high condition. The BNODE signal returns to the initial VDD–$V_{TH}$ low level.

Figure 1:
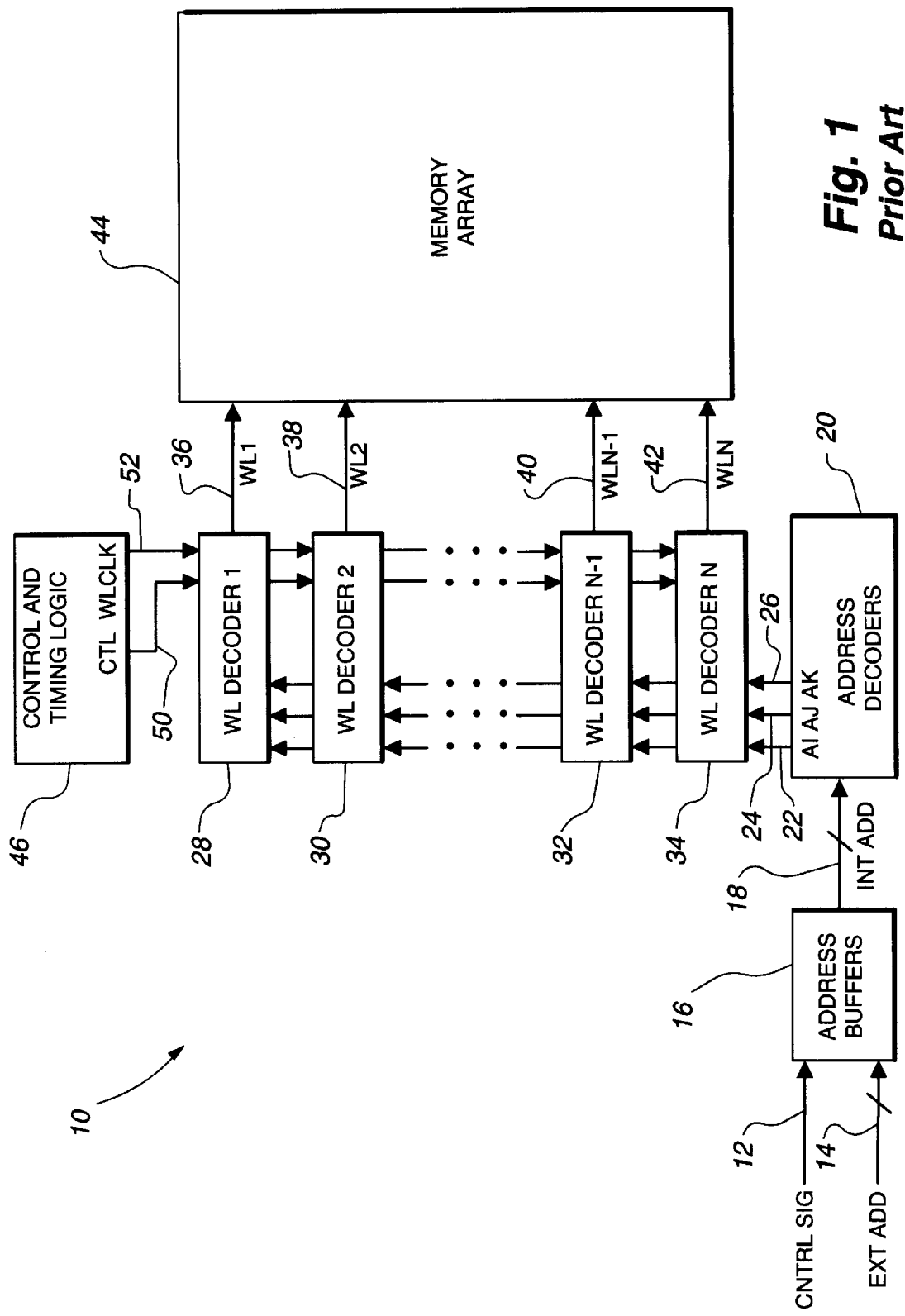
FIG. 1 a block diagram of a portion of a memory architecture showing word line decoders, a memory array, and supporting circuit blocks.
Figure 2:
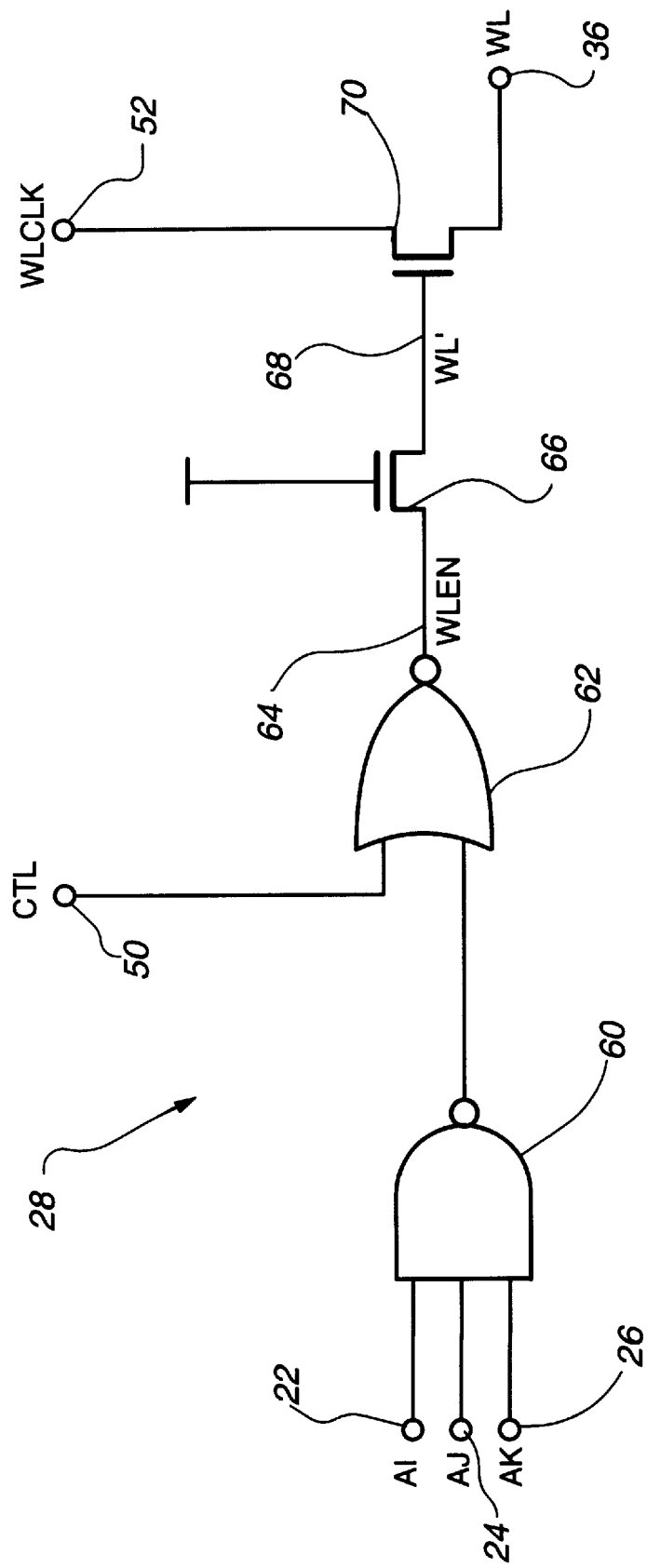

It is important to note that the use of the depletion mode device for capacitor-connected transistor M10 is desirable so that its channel does not collapse when WLON comes on at time t3. An enhancement or native-mode device can be used, however, as long as the threshold voltage $V_{TH}$ of M10 is kept very low (between –1.0 and +0.2 volts) so that it is always conducting. A low threshold voltage thus ensures good source/drain-gate coupling for efficient bootstrapping. A standard enhancement transistor can be used for M10. Low voltage performance will be slightly compromised, but should still exceed that of the word line decoder circuit shown in FIG. 2. As noted above, an oxide capacitor instead of a capacitor-connected transistor can be used for device M10. If a ferroelectric process is used, a ferroelectric capacitor can also be used for device M10.

One technique for further bootstrapping word lines 36A–42A can be seen in FIG. 6. Memory array 44 is shown in further detail in FIG. 6, wherein memory cells 84 can be seen coupled to each of the word lines. While eight memory cells 84 are shown coupled to each word line, any number can be used. Memory cells 84 can be either DRAM cells, FRAM® cells, or any other type of memory cells. Further coupled to each of the word lines is a single capacitor-connected transistor. Capacitor-connected transistor 86 is coupled to word line 36A; transistor 88 to word line 38A; transistor 90 to word line 40A; and transistor 92 to word line 42A. Note that capacitor-connected transistors 86–92 in FIG. 6 are standard enhancement MOS transistors that have the full $V_{TH}$ threshold voltage, so that they may be turned off for non-selected word lines and present no capacitive load to the BOOST DRIVE signal line 82.

Some time after t6 in FIG. 5, the BOOST DRIVE signal can be asserted on line 82 in FIG. 6, thus causing further capacitive coupling between the BOOST DRIVE signal and the selected word line. In this manner, the full VDD voltage of the selected word line is further boosted to a voltage that exceeds the power supply voltage.

If additional bootstrapping circuitry is not placed on the word lines transistor M7 need not be isolated and the CTL1 signal line can be eliminated. The description below, with reference to FIGS. 7–9, details the measures that can be taken to simplify the timing and circuitry of the word line driver of the present invention.

Turning now to FIG. 7, a memory architecture 94 is shown wherein the control and timing logic block 46B generates only the RDPCB signal on line 48B, the CTL2 signal on line 51B, and the WLCLK signal on line 52B. The word line decoders, described in further detail below, are now designated 28B, 30B, 32B, and 34B for driving word lines 36B, 38B, 40B, and 42B, respectively. There is no change to memory array 44, or to address buffer block 16, or to address decoder 20.

Turning now to FIG. 8, the core circuitry of the bootstrap circuit remains as in FIG. 4: transistors M7–M10, nodes 76–40, and control signal CTL2. The input of the core bootstrap circuit remains at node 76 and the output at node 36B, which is the word line that is driven. However, the input section has been modified to remove the CTL1 control signal. The input section of word line decoder 28B shown in FIG. 8 now includes a multiple input logic gate M1–M4 having three inputs for receiving the decoded word line addresses AI, AJ, and AK on inputs 22–26 and the precharge signal RDPCB on node 48B. An inverter M6 has an input coupled to the output of the multiple input logic gate at node 74, and an output coupled to node 76. Transistor M5, a P-channel transistor is coupled between nodes 74,76 and the VDD power supply as before. To clamp the non-selected word lines to ground, transistor M1 is coupled to nodes 74, 36B, and ground as before.

In the timing diagram of FIG. 9, the CTL1 control signal has been removed. Note that the WLGATE signal still transitions to a voltage level above the VDD power supply voltage, and for the entire duration of the high level of the WL word line signal. The initial conditions of the remaining node voltages are the same as those shown in FIG. 5.

It is not recommended that the bootstrapping circuitry shown in FIG. 6 be used with the word line decoder shown in FIG. 8. If further bootstrapping of the word line is required the WLCLK signal on node 52B can be modified. A separate power supply or charge-pumped voltage greater than the VDD power supply voltage would be required so that the WLCLK signal and, consequently, the WL signal could be driven above the VDD voltage.

Having described and illustrated the principles of the invention in a preferred embodiment thereof, it is appreciated by those having skill in the art that the invention can be modified in arrangement and detail without departing from such principles. For example, the exact timing and voltage levels shown in FIGS. 5 and 9 can be changed as required for different applications. The core bootstrap circuit can be surrounded by other input or output circuitry to drive loads other than the word line load as taught herein. With appropriate voltage bias changes, the polarity of the transistor devices can be "flipped" so that P-channel devices can be used for N-channel devices, and vice versa. We therefore claim all modifications and variation coming within the spirit and scope of the following claims.

We claim:

1. A bootstrap circuit having an input and an output, and which is energized by a VDD power supply voltage, the circuit comprising:

a first transistor having a first current node coupled to the input, a second current node, and a control node;

a second transistor having a first current node for receiving a clock signal, a second current node forming the output, and a control node coupled to the second current node of the first transistor; and means for generating a voltage greater than the VDD power supply voltage coupled to the control node of the first transistor.

2. A bootstrap circuit as in claim 1 further comprising:

a load coupled to the output of the bootstrap circuit; and means for turning off the second transistor such that the output of the bootstrap circuit is electrically isolated from the load.

3. A bootstrap circuit as in claim 2 in which the load comprises a word line coupled to a plurality of memory cells.

4. A bootstrap circuit as in claim 1 in which the generating means comprises:

a capacitor coupled between the input and the control node of the first transistor; and a third transistor having a first current node coupled to the control node of the first transistor, a second current node for receiving a first control signal, and a control for receiving the VDD power supply voltage.

5. A bootstrap circuit as in claim 4 in which the capacitor has a capacitance value C1, the total capacitance associated with the control node of the first transistor is C2, and wherein the ratio of C1 to C2 is greater than or equal to 0.8.

6. A bootstrap circuit as in claim 1 in which the capacitor comprises a capacitor-connected MOS transistor.

7. A bootstrap circuit as in claim 1 in which the capacitor composes a capacitor-connected MOS depletion-mode transistor having a low threshold voltage, whereby the channel of the transistor remains intact regardless of the voltage at the input of the bootstrap circuit.

8. A bootstrap circuit as in claim 1 further comprising an input section having a plurality of address inputs for receiving decoded word line addresses and an output coupled to the input of the bootstrap circuit.

9. A bootstrap circuit as in claim 8 in which the input section further comprises a precharge input for receiving a precharge signal and a control input for receiving a second control signal.

10. A bootstrap circuit as in claim 9 in which the input section comprises:
   a multiple input logic gate having a plurality of inputs for receiving the decoded word line addresses and the precharge signal, and an output;
   a NOR gate having a first input coupled to the output of the multiple input logic gate, a second input for receiving the second control signal, and an output coupled to the output of the input section; and
   a fourth transistor having a first current node for receiving the VDD power supply voltage, a second current node coupled to the output of the multiple input logic gate, and a control node coupled to the output of the input section.

11. A bootstrap circuit as in claim 10 in which the multiple input logic gate comprises an AND gate having three non-inverting inputs for receiving three decoded word line addresses, an inverting input for receiving the precharge signal, and an output.

12. A bootstrap circuit as in claim 10 in which the fourth transistor comprises a P-channel MOS transistor.

13. A bootstrap circuit as in claim 10 in which the input section further comprises a fifth transistor having a first current node coupled to the output of the bootstrap circuit, a second current node coupled to ground, and a control node coupled to the output of the multiple input logic gate.

14. A bootstrap circuit as in claim 8 in which the input section further comprises a precharge input for receiving a precharge signal.

15. A bootstrap circuit as in claim 14 in which the input section comprises:

a multiple input logic gate having a plurality of inputs for receiving the decoded word line addresses and the precharge signal, and an output;
an inverter having an input coupled to the output of the multiple input logic gate, and an output coupled to the output of the input section; and
a fourth transistor having a first current node for receiving the VDD power supply voltage, a second current node coupled to the output of the multiple input logic gate, and a control node coupled to the output of the input section.

16. A bootstrap circuit as in claim 15 in which the multiple input logic gate comprises an AND gate having three non-inverting inputs for receiving three decoded word line addresses, an inverting input for receiving the precharge signal, and an output.

17. A bootstrap circuit as in claim 15 in which the fourth transistor comprises a P-channel MOS transistor.

18. A bootstrap circuit as in claim 15 in which the input section further comprises a fifth transistor having a first current node coupled to the output of the bootstrap circuit, a second current node coupled to ground, and a control node coupled to the output of the multiple input logic gate.

19. A bootstrap circuit having an input and an output comprising:
   a first transistor having a first current node coupled to the input, a second current node, and a control node;
   a second transistor having a first current node for receiving a signal pulsed to VDD volts, a second current node forming the output, and a control node coupled to the second current node of the first transistor; and
   means for generating a voltage greater than VDD volts coupled to the control node of the first transistor.

20. A bootstrap circuit as in claim 19 further comprising:
   a load coupled to the output of the bootstrap circuit; and
   means for turning off the second transistor such that the output of the bootstrap circuit is electrically isolated from the load.

21. A bootstrap circuit as in claim 20 further comprising means for bootstrapping the output to a voltage greater than VDD volts.

22. A bootstrap circuit comprising:
   an input, an intermediate node, and an output capable of delivering a full VDD voltage to a load;
   a first transistor having a current path coupled between the input and the intermediate node, and a control node;
   means for temporarily generating a voltage greater than VDD coupled to the control node of the first transistor;
   a second transistor having a current path coupled between a clock voltage source and the output, and a control node coupled to the intermediate node.

* * * * *